(12) United States Patent
Yukimoto

(10) Patent No.: US 6,730,936 B2
(45) Date of Patent: May 4, 2004

(54) LIGHT-EMITTING DIODE ARRAY

(75) Inventor: Tomihisa Yukimoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/337,863

(22) Filed: Jan. 8, 2003

(65) Prior Publication Data

US 2003/0132447 A1 Jul. 17, 2003

(30) Foreign Application Priority Data

Jan. 11, 2002 (JP) ........................................ 2002-004874

(51) Int. Cl.[7] ................................................ H01L 33/00
(52) U.S. Cl. ........................... 257/88; 257/89; 257/93; 257/622; 257/623; 257/625
(58) Field of Search .............................. 257/88, 89–93, 257/622, 623, 625, 626, 910

(56) References Cited

U.S. PATENT DOCUMENTS

| | | | | |
|---|---|---|---|---|
| 5,386,139 A | * | 1/1995 | Idei et al. | 257/466 |
| 5,406,095 A | * | 4/1995 | Koyama et al. | 257/88 |
| 5,449,926 A | * | 9/1995 | Holm et al. | 257/88 |
| 5,663,581 A | * | 9/1997 | Holm et al. | 257/93 |

FOREIGN PATENT DOCUMENTS

| | | |
|---|---|---|
| JP | 2000-323750 | 11/2000 |
| JP | 2001326383 A * | 11/2001 |

* cited by examiner

*Primary Examiner*—Nathan J. Flynn
*Assistant Examiner*—Remmon R. Fordé
(74) *Attorney, Agent, or Firm*—Sughrue Mion, PLLC

(57) ABSTRACT

A light-emitting diode array comprising a conductive layer formed on a substrate, a plurality of separate light-emitting parts formed on the conductive layer, a first electrode formed on at least part of a top surface of each light-emitting part, and a second electrode formed on the conductive layer near the light-emitting part, the second electrode being a common electrode for operating a plurality of the light-emitting parts, and regions of the conductive layer between the adjacent light-emitting parts being removed.

8 Claims, 5 Drawing Sheets

LIGHT-EMITTING DIODE ARRAY

FIELD OF THE INVENTION

The present invention relates to a light-emitting diode array having a large light-emitting power, particularly to a light-emitting diode array suitably usable for light sources of electrophotographic printers.

BACKGROUND OF THE INVENTION

An electrophotographic printer forms electrostatic latent image on a photosensitive drum by light corresponding to an image signal, and toner is selectively attached to the electrostatic latent image for development and transferred onto a paper to obtain an image. Widely used as light sources for forming the latent image are of a laser type or a light-emitting diode array type. Particularly light sources constituted by light-emitting diode arrays are suitable for small printers and large-size printing, because they do not need long light paths unlike the laser-type light sources. Recent development of higher-speed, higher-quality printing and miniaturization of printers require light-emitting diode arrays with higher precision and higher output.

Widely known is a light-emitting diode comprising a pair of electrodes on a top surface (light-emitting side) and a rear surface sandwiching a semiconductor substrate and a light-emitting part on the substrate. When voltage is applied to electrodes provided on top and rear surfaces of a light-emitting diode having such a structure, electric current flows in a direction perpendicular to the semiconductor substrate, whereby electrons and holes are recombined in the light-emitting part to emit light. Though there is the maximum light output in the light-emitting part immediately under the top surface electrode, the light generated in this portion is reflected and absorbed by the top surface electrode, failing to be taken out efficiently. Accordingly, as light sources particularly in high-resolution printers of 600 dpi, 1200 dpi, etc., which should have light-emitting portions with small areas, conventional light-emitting diodes are insufficient in light-emitting power.

JP 2000-323750 A discloses a technology of improving the efficiency of taking out the generated light by forming cathodes and an anode on the same surface of a substrate. FIG. 3 is a plan view showing a light-emitting diode array having such a structure; FIG. 4 is a cross-sectional view taken along the line A–A' in FIG. 3; and FIG. 5 is a cross-sectional view taken along the line B–B' in FIG. 3. Incidentally, an insulating layer is omitted to clearly show the underlayers in FIG. 3. A plurality of light-emitting parts 2 are arranged on a p-type GaAs conductive layer 11 formed on an n-type GaAs substrate 10 at a predetermined interval. Each light-emitting part 2 is constituted by a p-type AlGaAs etched stopper layer 12, a p-type AlGaAs clad layer 13, a p-type AlGaAs active layer 14, an n-type AlGaAs clad layer 15 and an n-type GaAs capping layer 16, which are successively laminated on the p-type GaAs conductive layer 11. The light-emitting part 2 has a double hetero structure in a light emission region, which comprises a p-type AlGaAs clad layer 13, a p-type AlGaAs active layer 14 and an n-type AlGaAs clad layer 15.

Each light-emitting part 2 is formed by removing an epitaxial layer by mesa etching. Mesa-etched grooves are constituted by a first mesa-etched groove 21 separating light-emitting parts 2 from bonding portions 8 and second mesa-etched grooves 23 separating light-emitting parts 2.

Part of the top surface of each light-emitting part 2 is provided with a cathode 3. An anode 4 formed in a strip shape on the p-type GaAs conductive layer 11 near the light-emitting parts 2 is a common electrode for operating a plurality of light-emitting parts 2. The cathodes 3 and the anode 4 are formed on the mesa top surfaces of the light-emitting parts 2 and the p-type GaAs conductive layer 11, respectively, by vapor deposition and alloying of metals. The light-emitting parts 2 and the exposed surfaces of the conductive layer 11 except immediately under the cathodes 3 and the anode 4 are covered by an insulating film layer 17 of phosphosilicate glass (PSG). Each Au wiring layer 5 formed with its one end connected to each cathode 3 not covered by the insulating film layer 17 extends to a surface of the bonding portion 8, and the other end of each Au wiring layer 5 is provided with a bonding pad 6.

In the light-emitting diode array with such a structure, an electric current path 19 from the anode 4 to the cathode 3 passes through the light-emitting part 2, resulting in the generation of light L in the p-type AlGaAs active layer 14. This light L is emitted outside from a light-emitting portion 9 provided by removing the n-type GaAs capping layer 16 by etching.

However, in the above conventional light-emitting diode array, as is clear from FIGS. 3 and 4, there is the p-type GaAs conductive layer 11 in the second mesa-etched grooves 23 separating the light-emitting parts 2, there is an electric current path 20 that reaches the cathode 3 from the anode 4 without passing through the p-type AlGaAs active layer 14 in each light-emitting part 2 (FIG. 3). This electric current path 20 may be called "detour electric current pass." Because electric current passing through the detour electric current path 20 does not contribute to light emission, each light-emitting diode has low light-emitting power.

OBJECT OF THE INVENTION

Accordingly, an object of the present invention is to provide a light-emitting diode array free from a detour electric current path not contributing to light emission, thereby providing increased light-emitting power.

DISCLOSURE OF THE INVENTION

As a result of intensive research in view of the above object, the inventor has found that by removing a conductive layer on a substrate in regions corresponding to second mesa-etched grooves, the above detour electric current path can be eliminated, resulting in increase in the light-emitting power of each light-emitting diode. The present invention has been completed based on this finding.

Thus, the light-emitting diode array of the present invention comprises a conductive layer formed on a substrate, a plurality of separate light-emitting parts formed on the conductive layer, a first electrode formed on at least part of a top surface of each light-emitting part, and a second electrode formed on the conductive layer near the light-emitting part, the second electrode being a common electrode for operating a plurality of the light-emitting parts, and regions of the conductive layer between the adjacent light-emitting parts being removed.

In the light-emitting diode array of the present invention, the light-emitting parts are preferably formed by dividing an epitaxial layer formed on the conductive layer by mesa-etched grooves. The light-emitting diode array according to a preferred embodiment comprises a first mesa-etched groove separating the light-emitting parts from bonding portions for forming a plurality of separate light-emitting parts, and second mesa-etched grooves separating the light-emitting parts, portions of the conductive layer between the light-emitting parts being removed by the second mesa-etched grooves, whereby electric current does not flow between the first and second electrodes without passing through the light-emitting parts.

The mesa-etched grooves preferably are constituted by the first mesa-etched groove separating the light-emitting parts from the bonding portions and the second mesa-etched grooves for removing portions of the conductive layer between the light-emitting parts, in the shape of a comb as a whole.

In the light-emitting diode array of the present invention, electric current does not flow between the first electrodes and the second electrode without passing through the light-emitting parts, resulting in large recombination of electrons and holes in the epitaxial layer in the light-emitting parts and thus increased light-emitting power.

DESCRIPTION OF THE PREFERRED EMBODIMENTS

[1] Structure of Light-Emitting Diode Array

Figure 1:
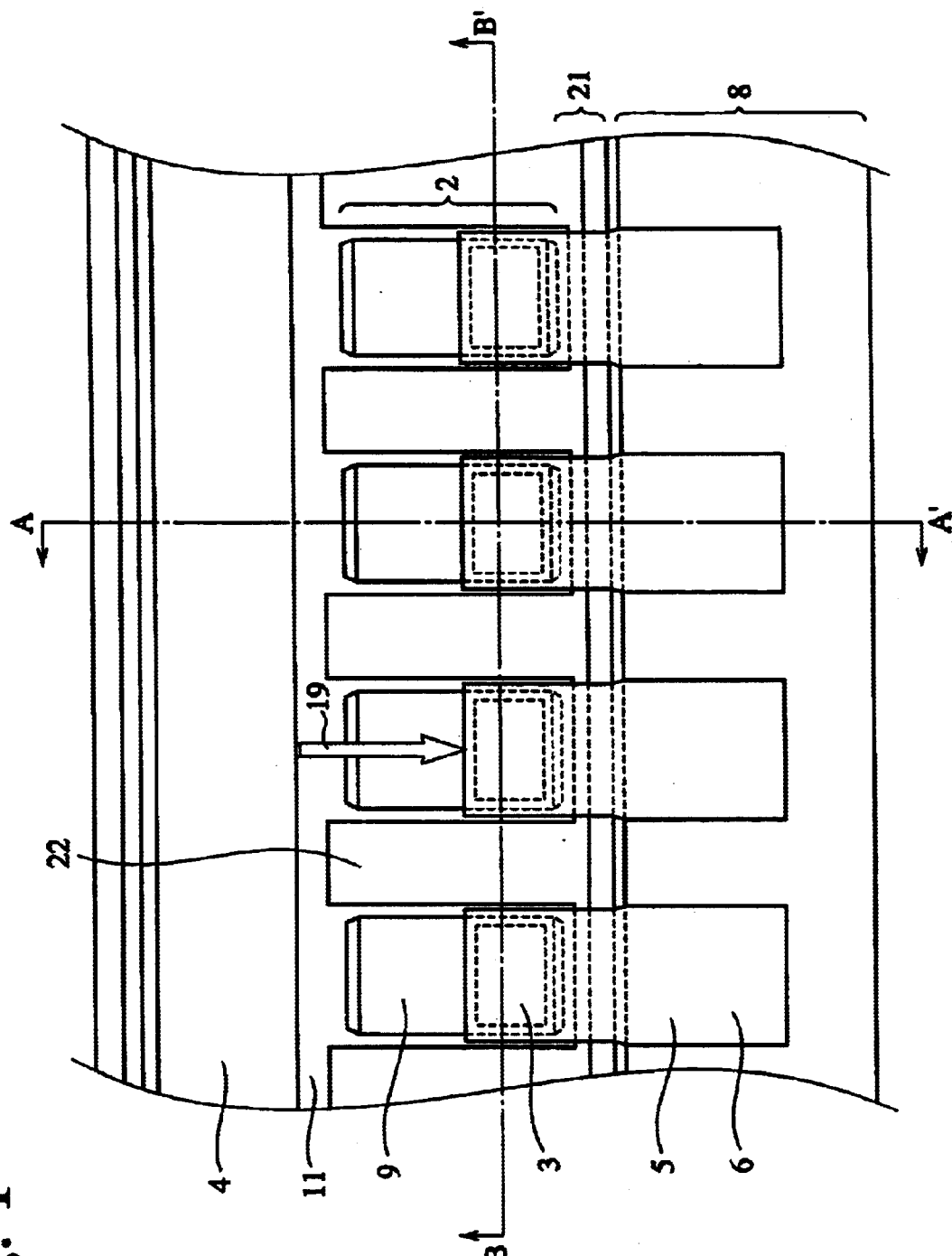
FIG. 1 is a plan view showing a light-emitting diode array according to one embodiment of the present invention.
Figure 2:
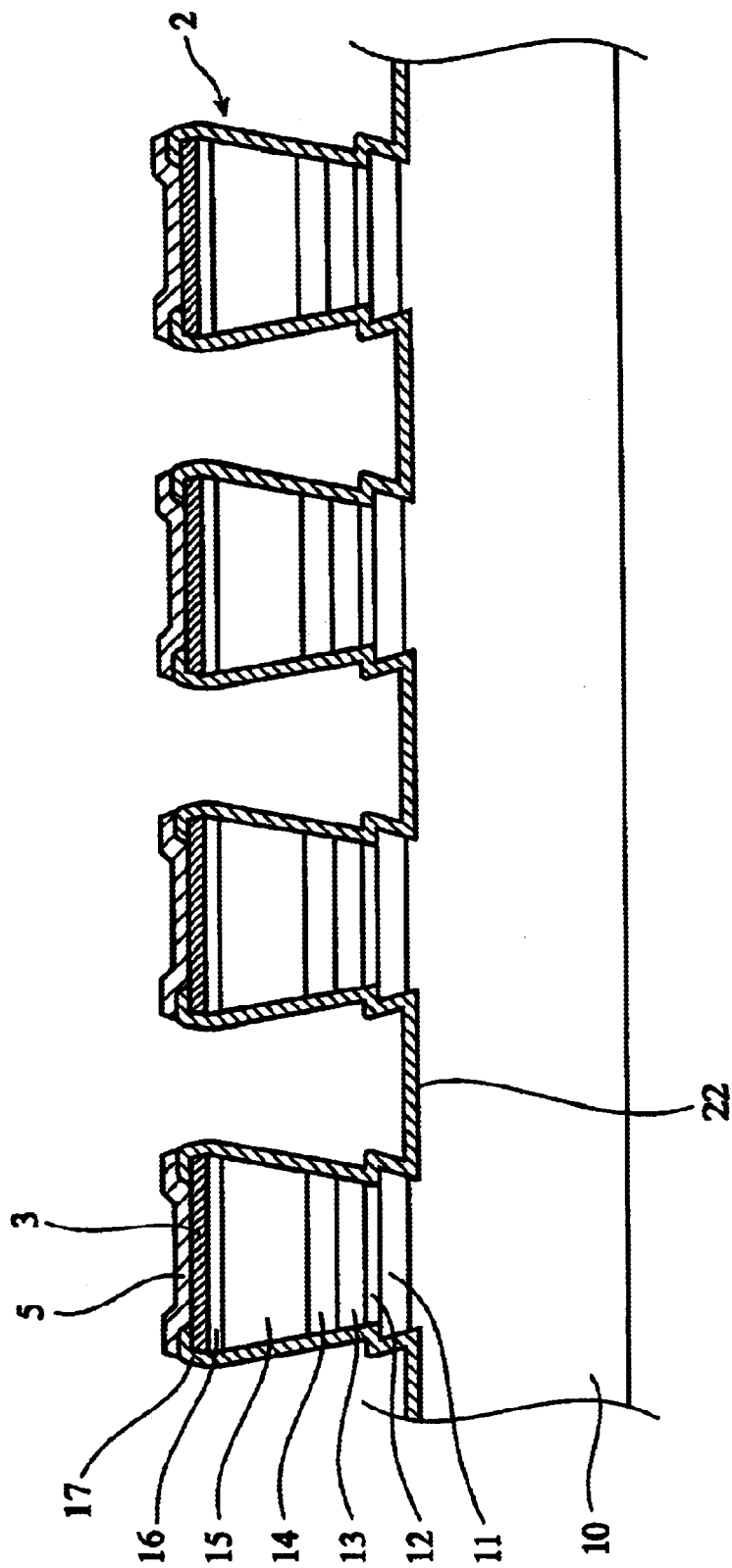
FIG. 2 is a cross-sectional view taken along the line B–B' in FIG. 1.
Figure 3:
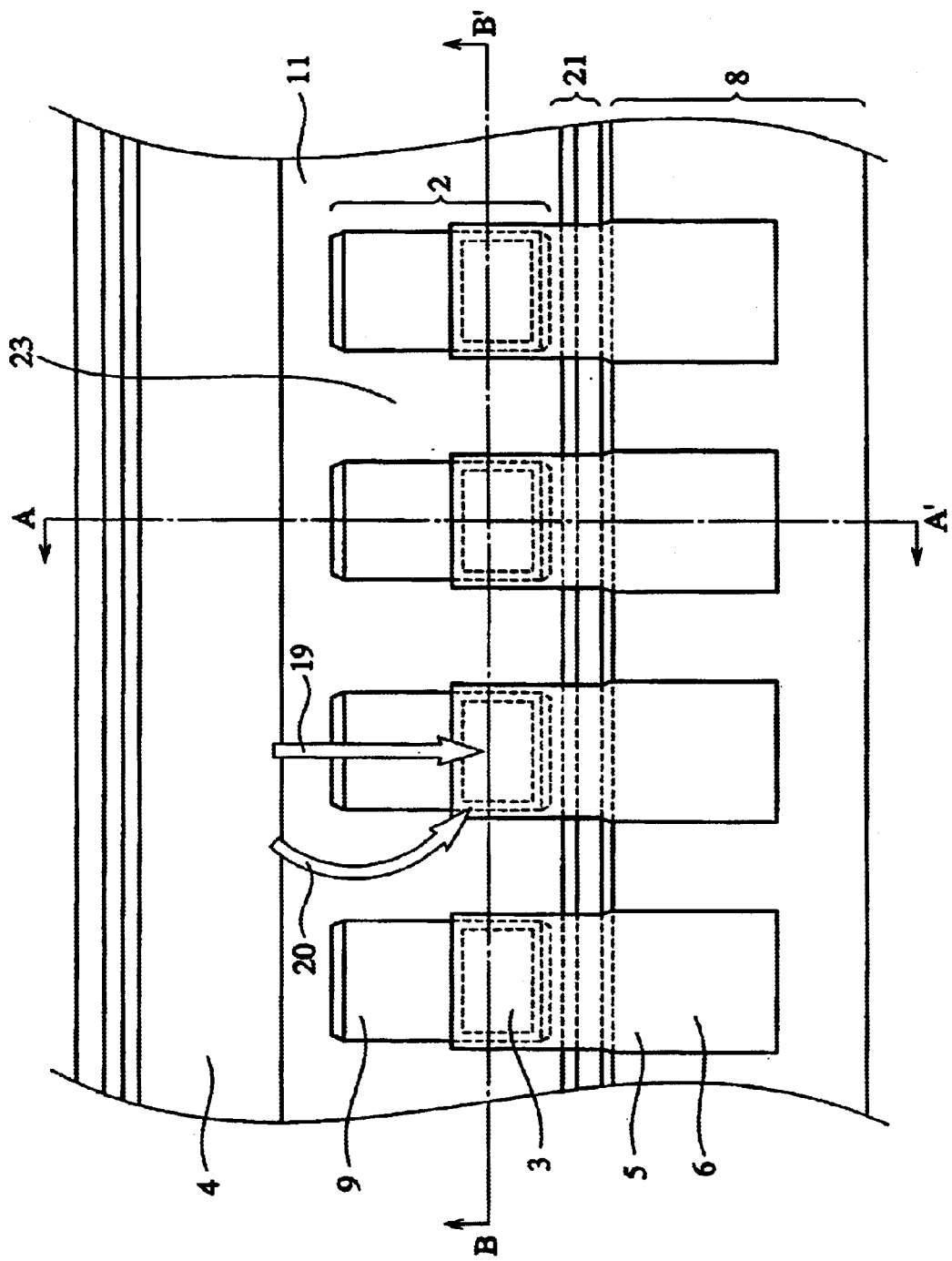
FIG. 3 is a plan view showing a conventional light-emitting diode array.
Figure 4:
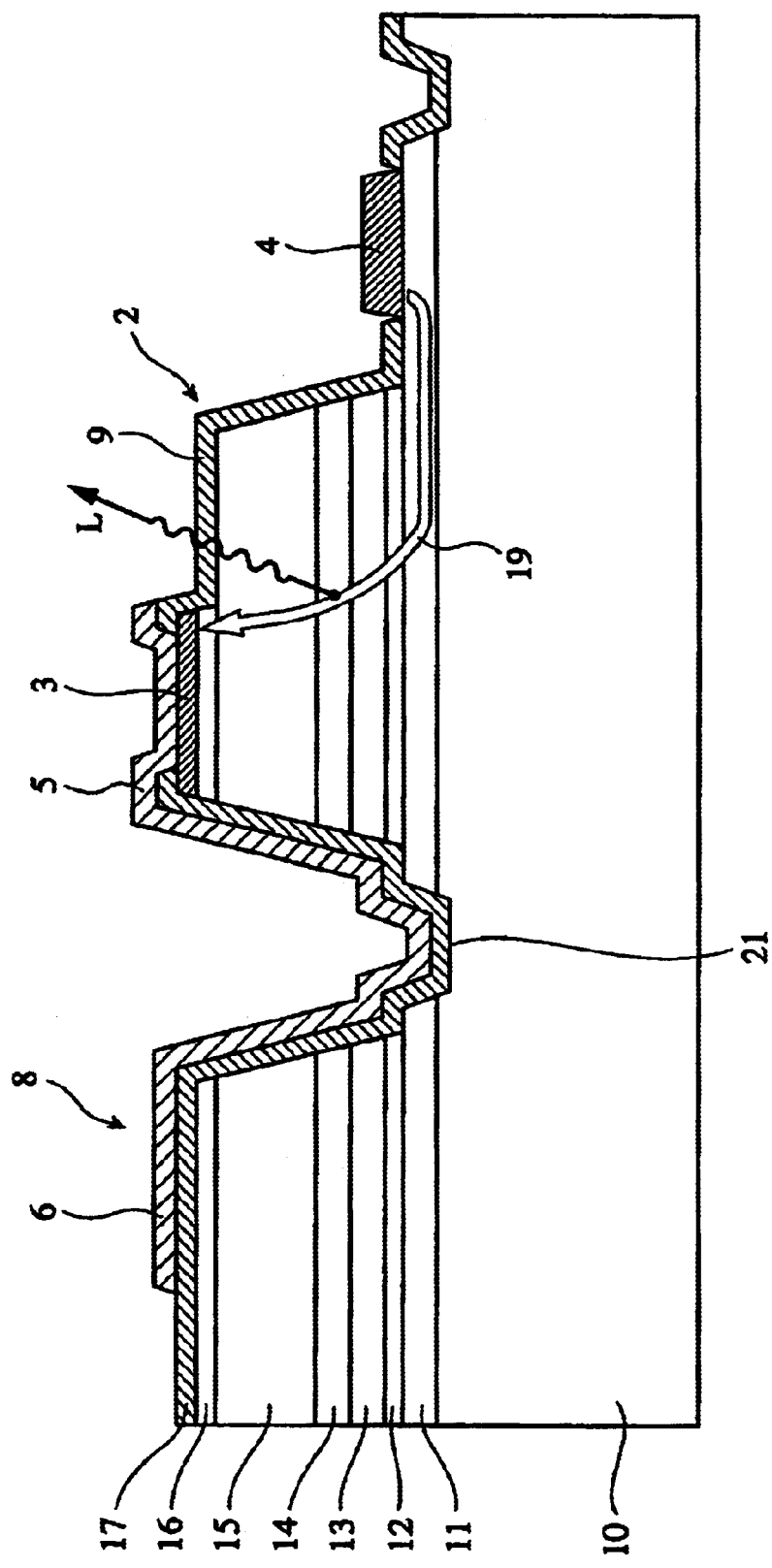
FIG. 4 is a cross-sectional view taken along the line A–A' in FIG. 3.
Figure 5:
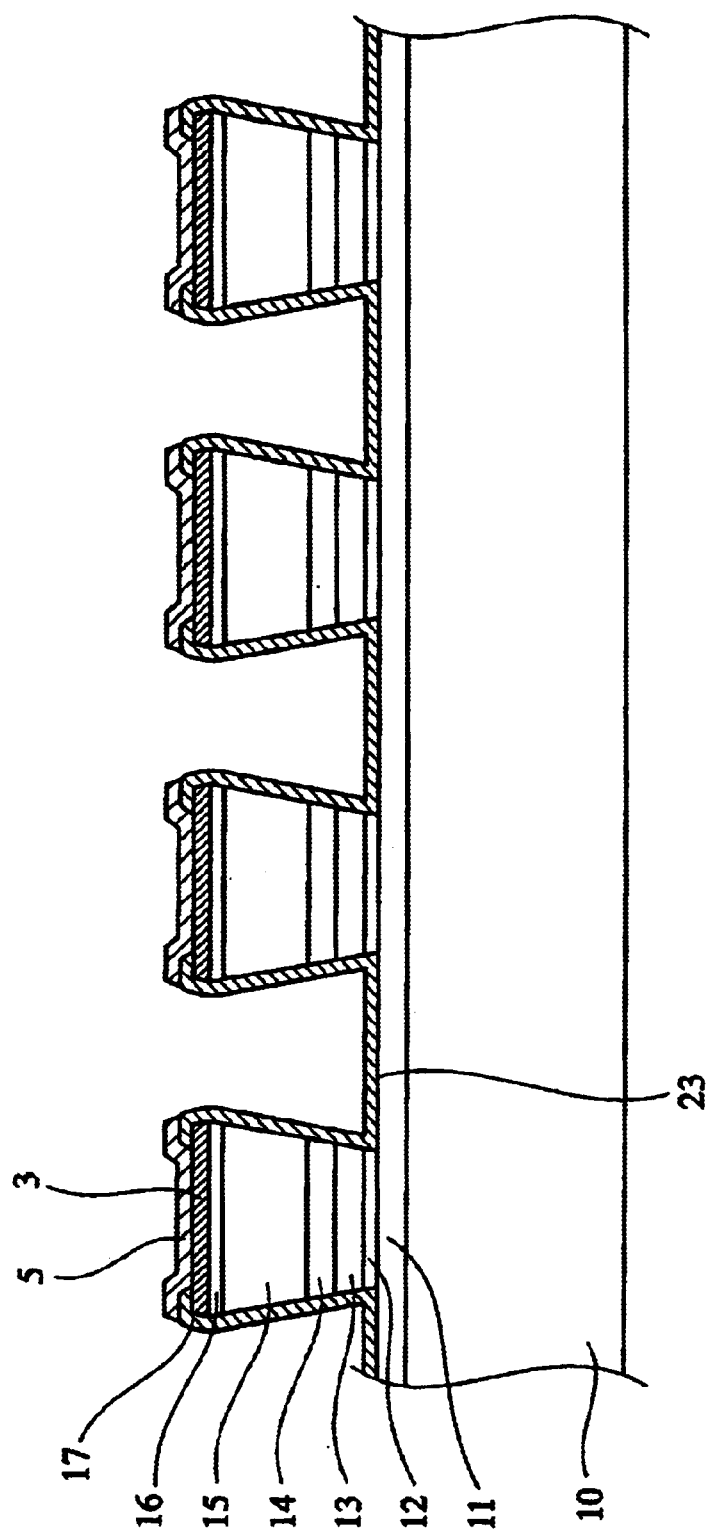
FIG. 5 is a cross-sectional view taken along the line B–B' in FIG. 3.

As shown in FIGS. 1 and 2 and FIG. 4 (the A–A' cross section of FIG. 1 is the same as the A–A' cross section of FIG. 3), the light-emitting diode array of the present invention comprises a substrate 10, a conductive layer 11 formed on an entire surface of the substrate 10, a plurality of separate light-emitting parts 2 formed on the conductive layer 11, a first electrode 3 partially formed on a top surface of each light-emitting part 2, and a second electrode 4 formed on the conductive layer 11 near the light-emitting parts 2. Incidentally, an insulating layer is omitted to clearly show the underlayers in FIG. 1. In the depicted embodiment, each light-emitting part 2 is a separate epitaxial layer portion formed by providing an epitaxial layer uniformly formed on the substrate 10 with mesa-etched grooves.

(1) Substrate

The substrate 10 is not particularly restrictive as long as it may be used for light-emitting diodes, and it need only have a structure capable of electrically insulating the light-emitting parts. It may be either an n-type substrate or a p-type substrate, and a semi-insulating substrate such as a semi-insulating GaAs substrate, etc. or an insulating substrate may also be used. The substrate 10 and the conductive layer 11 may be insulated from each other by forming a high-resistance layer such as an undoped GaAs layer, etc., or by forming a semiconductor layer having an opposite polarity to that of the conductive layer 11.

(2) Light-Emitting Part

The type of a compound semiconductor laminated on the conductive layer 11 on the substrate 10 and the thickness of a crystal layer (epitaxial layer) may be properly determined depending on the desired light emission wavelength and light-emitting power. Usable as the compound semiconductors are, for instance, AlGaAs, AlGaInP, etc. The light-emitting part 2 preferably has a double hetero structure comprising a clad layer of a first conductor type, an active layer and a clad layer of a second conductor type, which is preferably formed by dividing an epitaxial layer formed on the conductive layer 11 by mesa-etched grooves.

The light-emitting diode array according to the depicted embodiment of the present invention comprises separate light-emitting parts 2 each constituted by a p-type AlGaAs etched stopper layer 12, a p-type AlGaAs clad layer 13, a p-type AlGaAs active layer 14, an n-type AlGaAs clad layer 15 and an n-type GaAs capping layer 16 formed in this order on an n-type GaAs substrate 10 via a p-type GaAs conductive layer 11. The n-type GaAs capping layer 16 is removed by etching in regions of light-emitting portions 9. To prevent short-circuiting to an Au wiring layer 5, an insulating PSG layer 17 covers the entire surface of each light-emitting part 2 except for each cathode 3.

The above light-emitting part 2 has a so-called double hetero structure in a region directly contributing to light emission, which comprises a p-type AlGaAs active layer 14 having an energy band gap corresponding to an emission wavelength sandwiched by a p-type AlGaAs clad layer 13 (clad layer of a first conductor type) and an n-type AlGaAs clad layer 15 (clad layer of a second conductor type) both having larger energy band gaps than that of the active layer 14.

(3) Electrode and Wiring Layer

What is required is only that one of the first and second electrodes is a cathode, while the other is an anode. Accordingly, for instance, the first electrode per se may be either a cathode or an anode. Each electrode is preferably constituted by a plurality of metal layers, because it is required to have good bonding characteristics as well as good ohmic contact characteristics and adhesion to underlayers. Each electrode may have an oxide layer, and its uppermost layer is preferably a metal layer such as Au, etc. having good bonding characteristics. For instance, an AuZn/Ni/Au laminate electrode may be used as the anode, and an AuGe/Ni/Au laminate electrode may be used as the cathode.

Metal layers in each electrode may be formed by vapor deposition methods such as a resistance-heated vapor deposition method, an electron beam-heated vapor deposition method, etc., and oxide layers may be formed by various known layer-forming methods. The metal layers are preferably further subjected to a heat treatment (alloying) to have good ohmic contact characteristics.

In the depicted embodiment, a cathode 3 is formed on a mesa top surface of each light-emitting part 2, and a side surface of each light-emitting part 2 and a peripheral portion of each cathode 3 are covered by an insulating PSG layer 17. The cathode 3 on each light-emitting part 2 is connected to one end of each Au wiring layer 5, and the other end of each Au wiring layer 5 constitutes each bonding pad 6 of a bonding portion 8. On the other hand, the anode 4, a common electrode, is formed near each light-emitting part 2 in a strip shape on the p-type GaAs conductive layer 11 in an ohmic contact manner. With such a structure, the anode 4 is connected to the bonding pad 6 via the light-emitting part 2, the cathode 3 and the Au wiring layer 5.

(4) Mesa-Etched Grooves

The mesa-etched grooves for forming separate light-emitting parts 2 comprise a first mesa-etched groove 21 reaching the substrate 10 for electrically separating the light-emitting parts 2 from the bonding portions 8, and second mesa-etched grooves 22 for removing the conductive layer 11 between the light-emitting parts 2, both grooves 21, 22 being connected to each other in the shape of a comb as a whole. Incidentally, the second mesa-etched grooves 22 need only extend in regions at least between the adjacent light-emitting parts 2, and they may not reach the anode 4.

[2] Operation of Light-Emitting Diode Array

Because there is potential difference between the p-type GaAs conductive layer 11 in ohmic contact with the anode 4 and the cathode 3 formed on the top surface of each light-emitting part 2, an electric current path 19 always passes through the light-emitting part 2, thereby emitting light L from the p-type AlGaAs active layer 14 in each light emission region. The generated light L is taken out from the light-emitting portions 9.

An electric current path 20 flowing from the anode 4 to the cathode 3 without passing through the light-emitting part 2 as in conventional light-emitting diode arrays is blocked by the second mesa-etched grooves 22 in the present invention. Accordingly, the electric current path 19 passing through the p-type AlGaAs active layer 14 of the light-emitting part 2 has an increased electric current density, resulting in increase in the amount of light obtained. The light-emitting diode array having the depicted structure can generate as large light-emitting power as about 1.5 times that of the conventional array.

To further increase the light output of the light-emitting diode array, electric current may be guided to a lower region of the light-emitting portion 9 from the cathode 3. In this case, a current-blocking layer is formed immediately under the cathode 3, and a current diffusion layer is formed immediately under the light-emitting portion 9. The current diffusion layer is made of a compound having little absorption in a light emission wavelength and a small specific resistance. With this constitution, electric current is guided by the current-blocking layer from the cathode 3 to the lower region of the light-emitting portion 9, and uniformly diffused by the current diffusion layer into the entire lower region of the light-emitting portion 9, whereby it passes through the light-emitting part.

[3] Method for Producing Light-Emitting Diode Array

The light-emitting diode array of the present invention can be produced by the same methods as the conventional ones except for removing the conductive layer 11 between the light-emitting parts 2 by the second mesa-etched grooves 22. In a preferred production method, a p-type GaAs conductive layer 11 (carrier concentration: $4\times10^{19}$ cm$^{-3}$, thickness: 1 $\mu$m), a p-type AlGaAs etched stopper layer 12 (carrier concentration: $3\times10^{19}$ cm$^{-3}$, thickness: 0.5 $\mu$m), a p-type AlGaAs clad layer 13 (carrier concentration: $1\times10^{18}$ cm$^{-3}$, thickness: 1 $\mu$m), a p-type AlGaAs active layer 14 (carrier concentration: $1\times10^{18}$ cm$^{-3}$, thickness: 1 $\mu$m), an n-type AlGaAs clad layer 15 (carrier concentration: $2\times10^{18}$ cm$^{-3}$, thickness: 3 $\mu$m), and an n-type GaAs capping layer 16 (carrier concentration: $1\times10^{18}$ cm$^{-3}$, thickness: 0.5 $\mu$m) are caused to grow in this order on a top surface of the n-type GaAs substrate 10 by a metal-organic vapor phase epitaxy (MOVPE) method.

The formed crystal layer (epitaxial layer) is selectively subjected to wet etching. First, the n-type GaAs capping layer 16 of the light-emitting part 2 is removed except for a portion in contact with the cathode 3. The mesa-etched grooves 21, 22 are then formed to such depth that the p-type GaAs conductive layer 11 is exposed, such that the epitaxial layer on the p-type GaAs conductive layer 11 is divided to a plurality of light-emitting parts 2, and that the light-emitting parts 2 are separated from the bonding portions 8. Further, a region of the p-type GaAs conductive layer 11 between the light-emitting parts 2 and the bonding portions 8 is removed by the first mesa-etched groove 21, and a region of the conductive layer 11 between the adjacent light-emitting parts 2 is removed by the second mesa-etched groove 22. At this time, if the depth of both mesa-etched grooves 21, 22 were set such that the n-type GaAs substrate 10 is also slightly etched, no conductive layer 11 would remain even with etching errors.

After causing the PSG layer 17 to grow by a chemical vapor deposition (CVD) method such that it covers the entire top surface of the light-emitting diode array, only portions corresponding to the cathodes 3 and the anode 4 are removed by hydrofluoric acid, and AuGe/Ni/Au for the cathodes 3 and AuZn/Ni/Au for the anode 4 are then vapor-deposited to form the cathodes 3 and the anode 4. After causing the PSG layer 17 to grow by a CVD method again, so that it covers regions other than the anode 4, only portions of the PSG layer 17 on the cathodes 3 are removed by hydrofluoric acid, and the Au wiring layer 5 extending from the cathodes 3 to the bonding portions 8 is formed.

As described above in detail, because the light-emitting diode array of the present invention has a conductive layer removed by mesa-etched grooves in regions between the adjacent light-emitting parts, electric current does not flow between the first and second electrodes without passing through light-emitting parts. Therefore, electric current passing through the active layer of the light-emitting part has a large current density, resulting in increase in light-emitting power. Such light-emitting diode arrays are suitable for light sources of electrophotographic printers, etc.

What is claimed is:

1. A light-emitting diode array comprising a conductive layer formed on a substrate, a plurality of separate light-emitting parts formed on said conductive layer, a first electrode formed on at least part of a top surface of each light-emitting part, and a second electrode formed on said conductive layer near said light-emitting part, said second electrode being a common electrode for operating a plurality of said light-emitting parts, and regions of said conductive layer between the adjacent light-emitting parts being removed.

2. The light-emitting diode array according to claim 1, which comprises a first mesa-etched groove separating said light-emitting parts from bonding portions for forming a plurality of separate light-emitting parts, and second mesa-etched grooves separating said light-emitting parts, portions of said conductive layer between said light-emitting parts being removed by said second mesa-etched grooves, whereby electric current does not flow between said first electrodes and said second electrode without passing through said light-emitting parts.

3. The light-emitting diode array according to claim 2, wherein mesa-etched grooves comprising said first mesa-etched groove and said second mesa-etched grooves are in the shape of a comb, wherein the first mesa-etched grooves extend in one direction adjacent the light emitting parts and the second mesa-etched grooves are arranged in a direction perpendicular to said first mesa-etched grooves.

4. The light-emitting diode array according to claim 1, wherein said second electrode is connected to a bonding pad via each light-emitting part.

5. The light-emitting diode array according to claim 2, wherein said second electrode is connected to a bonding pad via each light-emitting part.

6. The light-emitting diode array according to claim 3, wherein said second electrode is connected to a bonding pad via each light-emitting part.

7. The light-emitting diode array according to claim 1, wherein each light-emitting part formed on said conductive layer is an epitaxial layer.

8. The light-emitting diode array according to claim 1, wherein each removed region of said conductive layer between the adjacent light-emitting parts extends into said substrate.

* * * * *